United States Patent
Yamaguchi

(10) Patent No.: US 8,367,437 B2
(45) Date of Patent: Feb. 5, 2013

(54) METHOD OF MANUFACTURING LIGHT-EMITTING DEVICE

(75) Inventor: Seiji Yamaguchi, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 37 days.

(21) Appl. No.: 13/067,724

(22) Filed: Jun. 22, 2011

(65) Prior Publication Data
US 2012/0052607 A1 Mar. 1, 2012

(30) Foreign Application Priority Data
Aug. 31, 2010 (JP) ................................. 2010-193277

(51) Int. Cl.
*H01L 33/54* (2010.01)
(52) U.S. Cl. .................. 438/26; 65/24; 65/106; 65/155; 257/E33.059
(58) Field of Classification Search ..................... 438/26; 65/24, 106, 155; 257/E33.059
See application file for complete search history.

(56) References Cited

U.S. PATENT DOCUMENTS
4,389,276 A * 6/1983 deVries ............................ 216/6
2004/0095060 A1 * 5/2004 Ushifusa et al. .............. 313/495
2006/0261364 A1 11/2006 Suehiro et al.
2009/0186433 A1 7/2009 Yamaguchi et al.
2010/0308476 A1 * 12/2010 Suga et al. ..................... 257/792
2012/0052607 A1 * 3/2012 Yamaguchi ..................... 438/27
2012/0083056 A1 * 4/2012 Shinbori et al. ................ 438/27
2012/0171789 A1 * 7/2012 Suehiro et al. .................. 438/28
2012/0207991 A1 * 8/2012 Arai et al. ...................... 428/216

FOREIGN PATENT DOCUMENTS
JP 2009-177131 A 8/2009

* cited by examiner

*Primary Examiner* — George Fourson, III
(74) *Attorney, Agent, or Firm* — McGinn IP Law Group, PLLC

(57) ABSTRACT

A method of manufacturing a light-emitting device includes arranging a plate-shaped glass on a light-emitting element mounting surface of a substrate having a light-emitting element mounted thereon, arranging a metal thin plate on the plate-shaped glass so as to sandwich the plate-shaped glass between the substrate and the metal thin plate, placing the substrate, the plate-shaped glass and the metal thin plate between a first mold on a side of the substrate and a second mold on a side of the metal thin plate, hot-pressing the substrate, the plate-shaped glass and the metal thin plate by using the first mold and the second mold to seal the light-emitting element with the plate-shaped glass, and after cooling the plate-shaped glass, removing the thin plate adhered to the plate-shaped glass from the plate-shaped glass.

5 Claims, 4 Drawing Sheets

METHOD OF MANUFACTURING LIGHT-EMITTING DEVICE

The present application is based on Japanese Patent Application No. 2010-193277 filed on Aug. 31, 2010, the entire contents of which are incorporated herein by reference.

BACKGROUND OF THE INVENTION

1. Field of the Invention

The invention relates to a method of manufacturing a light-emitting device such that a light-emitting element is glass-sealed on a mounting substrate by using a mold.

2. Related Art

JP-A-2009-177131 discloses a light-emitting device that a light-emitting element is sealed with glass on a wiring board. The light-emitting device disclosed in JP-A-2009-177131 is produced such that plural light-emitting elements are mounted on a wiring board, the light-emitting elements are collectively glass-sealed by hot pressing with a plate-shaped low-melting-point glass, and single pieces are formed by subsequent dicing.

SUMMARY OF THE INVENTION

However, the method of manufacturing the light-emitting device as disclosed in JP-A-2009-177131 is conducted such that low-melting-point glass softened by heating is stacked on the mounting surface of the wiring board on which the plural light-emitting elements are mounted, the hot pressing is performed using upper and lower molds temperature, of which is adjusted by a heater to fusion-bond the low-melting-point glass to the mounting surface of the wiring board, and the light-emitting elements are thereby sealed. After the hot pressing, the upper mold is separated from the lower mold to take out the wiring board and the light-emitting elements which are sealed with the low-melting-point glass, and there is a case that, at the time of separating the upper mold, a portion of the low-melting-point glass is removed due to adhesion to the upper mold or that the low-melting-point glass cannot be taken off from the upper mold. In such a case, the wiring board and the light-emitting elements cannot be used as a finished product and work to remove the low-melting-point glass from the upper mold is also required.

Accordingly, it is an object of the invention to provide a method of manufacturing a light-emitting device that can prevent the heated glass from adhering to the mold.

(1) According to one embodiment of the invention, a method of manufacturing a light-emitting device comprises:

arranging a plate-shaped glass on a light-emitting element mounting surface of a substrate having a light-emitting element mounted thereon;

arranging a metal thin plate on the plate-shaped glass so as to sandwich the plate-shaped glass between the substrate and the metal thin plate;

placing the substrate, the plate-shaped glass and the metal thin plate between a first mold on a side of the substrate and a second mold on a side of the metal thin plate;

hot-pressing the substrate, the plate-shaped glass and the metal thin plate by using the first mold and the second mold to seal the light-emitting element with the plate-shaped glass; and after cooling the plate-shaped glass, removing the thin plate adhered to the plate-shaped glass from the plate-shaped glass.

In the above embodiment (1) of the invention, the following modifications and changes can be made.

(i) The metal thin plate has such a flexibility that it is deformed by an external force less than the cooled plate-shaped glass.

(ii) The metal thin plate comprises one of tantalum, molybdenum, stainless steel and copper, and has a thickness of 0.02 to 0.5 mm.

(iii) The second mold comprises a protrusion formed protruding toward the first mold, and the metal thin plate is formed along a shape of a pressing surface of the second mold including the protrusion.

(iv) The protrusion is, in a bottom view of the second mold, shaped like a rectangular frame having a width about equal to that of the plate-shaped glass.

Points of the Invention

According to one embodiment of the invention, a method of manufacturing a light-emitting device is conducted such that an upper mold presses a glass plate via a thin plate relative to a lower mold on which a substrate with a light-emitting element mounted thereon is mounted, so that the hot pressing can be performed without a direct contact between the upper mold and the glass plate. Thereby, after the hot pressing step, it is possible to easily separate the upper mold from the glass (bonded to the substrate for sealing the light-emitting element) and there is no possibility that a portion of the softened glass adheres to and remains on the upper mold.

BRIEF DESCRIPTION OF THE DRAWINGS

Next, the present invention will be explained in more detail in conjunction with appended drawings, wherein:

FIGS. 2A and 2B are schematic views showing a pressing machine for performing a hot pressing step and an $Al_2O_3$ substrate, etc., placed thereon, wherein FIG. 2A shows a state before the hot pressing step and FIG. 2B shows a state during the hot pressing step;

FIGS. 4A and 4B are schematic views showing a pressing machine for performing a hot pressing step and an $Al_2O_3$ substrate, etc., placed thereon in a second embodiment of the invention, wherein FIG. 4A shows a state before the hot pressing step and FIG. 4B shows a state during the hot pressing step.

DESCRIPTION OF THE PREFERRED EMBODIMENTS

First Embodiment
Structure of Light-Emitting Device 1

Figure 1:
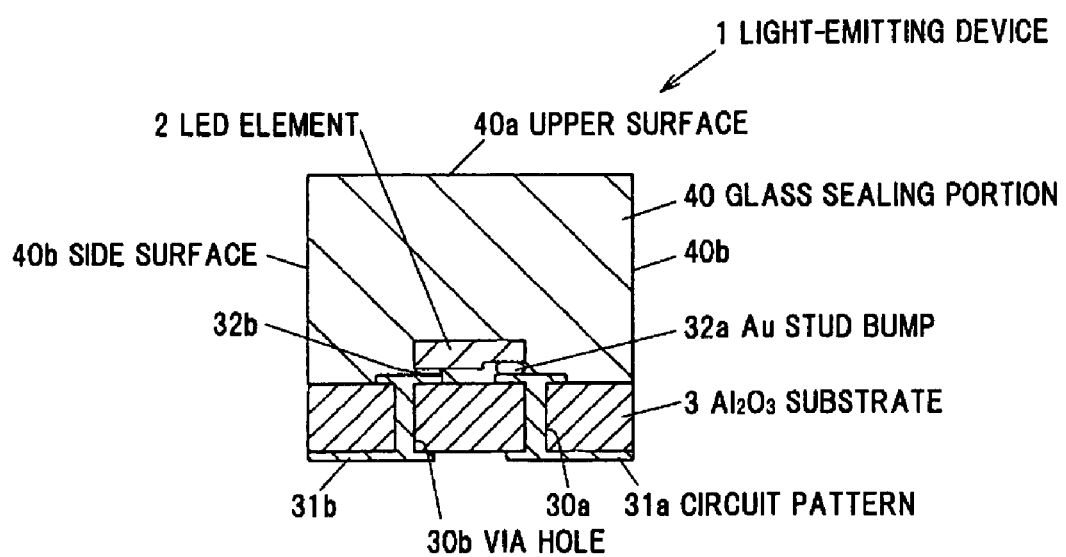
FIG. 1 is a cross sectional view showing a light-emitting device in a first embodiment of the present invention.

FIG. 1 is a vertical cross sectional view showing a light-emitting device in a first embodiment of the invention.

A light-emitting device 1 has a flip-chip-type LED (Light Emitting Diode) element 2 as a light-emitting element formed of a GaN-based semiconductor material, an $Al_2O_3$ substrate 3 for mounting the LED element 2, circuit patterns 31a and 31b formed of tungsten (W)-nickel (Ni)-gold (Au) and formed in the $Al_2O_3$ substrate 3, Au stud bumps 32a and 32b for electrically connecting the LED element 2 to the circuit patterns 31a and 31b, and a glass sealing portion 40 which seals the LED element 2 and is adhered to the $Al_2O_3$ substrate 3.

The $Al_2O_3$ substrate 3 has via holes 30a and 30b for inserting through the circuit patterns 31a and 31b which are metallized on front and rear surfaces of the $Al_2O_3$ substrate 3 and are formed of W—Ni—Au.

The glass sealing portion 40 is formed of low-melting-point glass, is cut by a dicer after adhesion to the $Al_2O_3$ substrate 3 by a hot pressing step using a mold, and is thereby formed in a rectangular shape which has an upper surface 40a and a side surface 40b.

The light-emitting device 1 configured as described above emits light of the LED element 2 from the upper surface 40a and the side surface 40b of the glass sealing portion 40 by conducting electricity to the LED element 2 via the circuit patterns 31a, 31b and the Au stud bumps 32a, 31b.

Method of Manufacturing the Light-Emitting Device 1

A method of manufacturing the light-emitting device 1 will be described below in reference to FIGS. 2 and 3. The method of manufacturing the light-emitting device 1 includes a mounting step in which the LED element 2 is mounted on the $Al_2O_3$ substrate 3, a substrate arranging step in which the $Al_2O_3$ substrate 3 having the LED element 2 mounted thereon is arranged in a pressing machine 10, a glass arranging step in which a glass 4 to be the glass sealing portion 40 is arranged on the $Al_2O_3$ substrate 3, a thin plate arranging step in which a thin plate 7 is arranged on the glass 4, a hot pressing step in which the glass 4 is heated and hot-pressed on the $Al_2O_3$ substrate 3, a thin plate removal step for removing the thin plate 7 after the hot pressing, and a dicing step for singulating the LED elements 2 by dicing to complete the light-emitting device 1. Each of the steps will be described in detail below.

Mounting Step

Firstly, the $Al_2O_3$ substrate 3 having the via holes 30a and 30b formed therein is prepared, and a tungsten paste is screen-printed on the front and rear surfaces of the $Al_2O_3$ substrate 3 according to the shape of the circuit patterns 31a and 31b. The $Al_2O_3$ substrate 3 has a size which allows mounting of plural LED elements 2 (e.g., 22.5 mm square), and the via holes 30a and 30b are formed for each LED element 2.

Next, the $Al_2O_3$ substrate 3, on which the tungsten paste is printed, is heat-treated at a temperature above 1000° C. to bake tungsten on the substrate 3, and Ni plating and Au plating are then applied on the tungsten, thereby forming the circuit patterns 31a and 31b. Then, plural LED elements 2 are mounted on the $Al_2O_3$ substrate 3 on the element mounting surface side (on the front side), and respective electrodes of the LED element 2 are electrically connected to the circuit patterns 31a and 31b by the Au stud bumps 32a and 32b.

Substrate Arranging Step

Figure 2A:
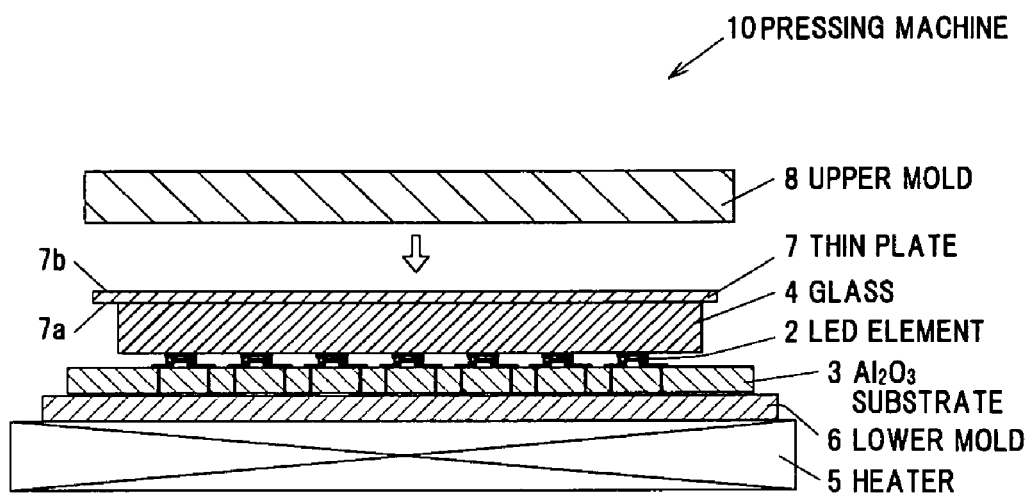
Figure 2B:
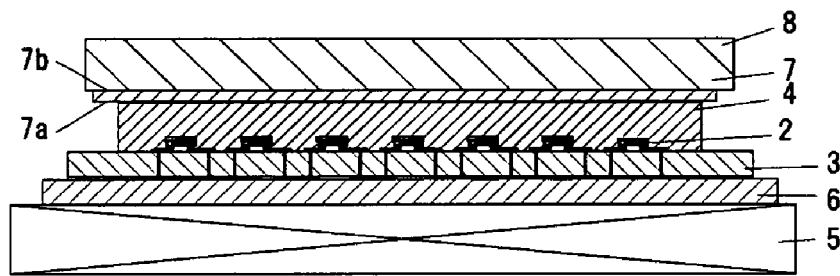

FIGS. 2A and 2B are schematic views showing a pressing machine 10 for performing a hot pressing step and an $Al_2O_3$ substrate 3, etc., placed thereon, wherein FIG. 2A shows a state before the hot pressing step and FIG. 2B shows a state during the hot pressing step.

As shown in FIG. 2A, the pressing machine 10 has a heater 5, a lower mold 6 as a first mold which is heated by the heater 5, and an upper mold 8 as a second mold which is arranged to face the lower mold 6 and is relatively movable in a direction perpendicular to the lower mold 6.

In the substrate arranging step, the $Al_2O_3$ substrate 3 having the plural LED elements 2 mounted thereon is placed on the lower mold 6 so that a rear surface of the $Al_2O_3$ substrate 3 is in contact with the lower mold 6.

Glass Arranging Step

In the glass arranging step, the plate-shaped glass 4 to be the glass sealing portion 40 of the light-emitting device 1 (see FIG. 1) is arranged so as to face the element mounting surface (upper surface) of the $Al_2O_3$ substrate 3 on which the plural LED elements 2 are mounted. The glass 4 is formed of low-melting-point glass having the property of being softened at a temperature of 600° C. or less, is formed smaller than the $Al_2O_3$ substrate 3 (e.g., 20.0 mm square), and has a predetermined thickness (e.g., 0.7 mm). In addition, the glass 4 is placed parallel to the $Al_2O_3$ substrate 3 so that a lower surface of the glass 4 is in contact with surfaces of the plural LED elements 2 without any portions which are out of the $Al_2O_3$ substrate 3.

Thin Plate Arranging Step

In the thin plate arranging step, the thin plate 7 is arranged to face a surface of the glass 4 opposite to the surface thereof facing the $Al_2O_3$ substrate 3. The thin plate 7 is a metal plate mainly containing at least one metal selected from the group consisting of tantalum, molybdenum, stainless steel and copper and having a thickness of 0.02 to 0.5 mm which is thinner than the glass 4. In addition, the thin plate 7 is larger than the glass 4 (e.g., 21.0 mm square), and is placed to cover the entire glass 4 so that a lower surface 7a on the lower mold 6 side is in contact with the surface of the glass 4.

Hot Pressing Step

Firstly, in the hop pressing step, heat generated by the heater 5 is conducted to the glass 4 via the lower mold 6, the $Al_2O_3$ substrate 3 and the LED element 2 to soften the glass 4. Then, the hot pressing step is performed by moving the upper mold 8 toward the lower mold 6 using a pressure device of which illustration is omitted, and then by pressing the softened glass 4 against the $Al_2O_3$ substrate 3 in a nitrogen atmosphere at a predetermined pressure. In the present embodiment, the glass 4 is heated to 600° C. or more, and the upper mold 8 is subsequently pressed toward the lower mold 6 at a pressure of 60 kgf. Here, the upper mold 8 may be heated to a temperature equivalent to or lower than the temperature of the lower mold 6.

By performing the hot pressing step, the glass 4 is fusion-bonded to the element mounting surface of the $Al_2O_3$ substrate 3 in a region where the LED elements 2 are not mounted, and each of the LED elements 2 is sealed with the glass 4.

Meanwhile, in the hot pressing step, the thin plate 7 is interposed between the upper mold 8 and the glass 4, and the upper mold 8 presses the glass 4 via the thin plate 7. Therefore, the upper mold 8 is in contact with an upper surface 7b of the thin plate 7 but is not directly in contact with the glass 4.

After completing the hot pressing step, the upper mold 8 is moved upward to separate from the lower mold 6, and the $Al_2O_3$ substrate 3 having the glass-sealed plural LED elements 2 mounted thereon is taken out from the pressing machine 10. The thin plate 7 is adhered to the surface of the glass 4 at this stage.

Thin Plate Removal Step

Figure 3:
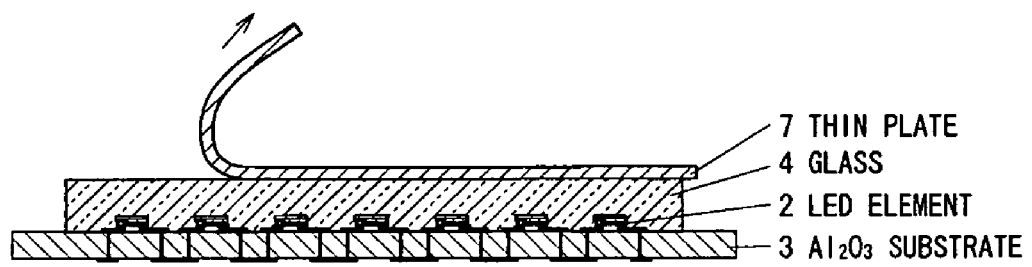
FIG. 3 is a schematic view showing a state in which a thin plate is being removed from glass in a thin plate removal step.

FIG. 3 is a schematic view showing a state in which the thin plate 7 is being removed from the glass 4 in a thin plate removal step.

In the thin plate removal step, after the hot-pressed glass 4 is cooled and hardened, the thin plate 7 is removed from the glass 4. This work can be done manually by, e.g., fixing the $Al_2O_3$ substrate 3 to a jig and gripping the glass 4 using a tool, etc. The thin plate 7 has flexibility such as being deformed by an external force more easily than the hardened glass 4, and can be removed from the glass 4 without largely deflecting the glass 4.

Dicing Step

In the dicing step, the glass 4 after removal of the thin plate 7 is cut together with the $Al_2O_3$ substrate 3 by dicing and is singulated to form plural light-emitting devices 1. The dicing is performed by placing the $Al_2O_3$ substrate 3 on a dicer and then cutting between the plural LED elements 2 using a dicing blade. The LED element 2, the $Al_2O_3$ substrate 3, the circuit patterns 31a, 31b and the glass 4 (the glass sealing portion 40), which are each singulated, constitute the light-emitting device 1.

Effects of the Embodiment

The following effects are obtained by the above described embodiment.

(1) Since the upper mold 8 presses the glass 4 via the thin plate 7, it is possible to perform the hot pressing step without contact between the upper mold 8 and the glass 4. Therefore, after the hot pressing step, it is possible to easily separate the upper mold 8 from the glass 4 and there is no possibility that a portion of the softened glass 4 adheres to and remains on the upper mold 8.

(2) Since the $Al_2O_3$ substrate 3 and the glass 4 which are hot-pressed can be directly taken out from the pressing machine 10, it is possible to promptly perform the next hot pressing step by the pressing machine 10.

(3) Since the main component of the thin plate 7 is tantalum, molybdenum, stainless steel or copper, the thin plate 7 has adequate flexibility and can be taken out without damaging the glass 4.

Second Embodiment

Next, the second embodiment of the invention will be described in reference to FIG. 4.

Figure 4A:
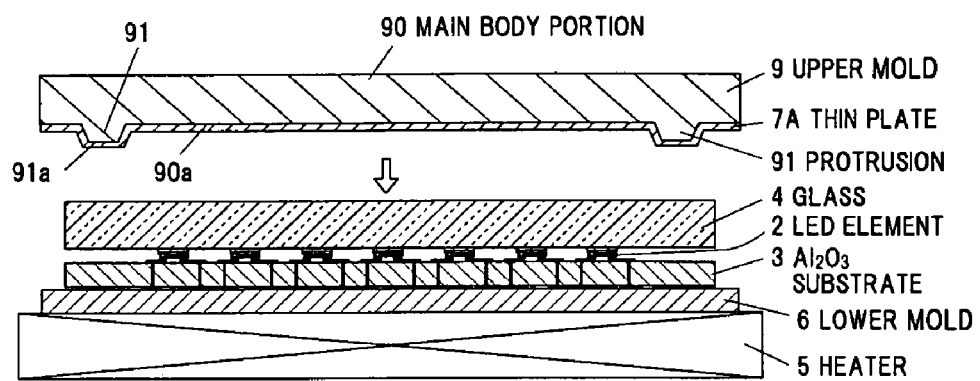
Figure 4B:
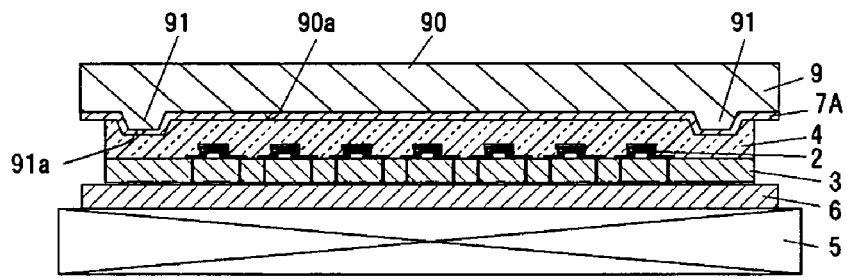

FIGS. 4A and 4B are schematic views showing a hot pressing step in a manufacturing method of the present embodiment, wherein FIG. 4A shows a state before the hot pressing step and FIG. 4B shows a state during the hot pressing step.

The present embodiment is different from the first embodiment in that an upper mold 9 has a plate-shaped main body portion 90 and a protrusion 91 formed to protrude from the main body portion 90 toward the lower mold 6, and that a thin plate 7A is formed along a pressing surface of the upper mold 9, as shown in FIG. 4A. The protrusion 91 is shaped like a rectangular frame (in the bottom view of the upper mold 9) so as to surround a region of the $Al_2O_3$ substrate 3 in which the plural LED elements 2 are mounted.

The thin plate 7A is a metal plate mainly containing at least one metal selected from the group consisting of tantalum, molybdenum, stainless steel and copper and having a thickness of 0.02 to 0.5 mm, in the same manner as the first embodiment. In addition, the thin plate 7A is preliminarily molded in a shape along a pressing surface 90a of the main body portion 90 and a pressing surface 91a of the protrusion 91 of the upper mold 9, and is held by a locking member, of which illustration is omitted, fixed to the upper mold 9 so as to be in contact with the pressing surfaces 90a and 91a of the upper mold 9.

As shown in FIG. 4B, when the upper mold 9 is pressed toward the lower mold 6, the protrusion 91 is embedded into the glass 4 and an outward flow of the glass 4 due to pressure is restricted.

After the hot pressing step, the thin plate removal step and the dicing step are performed in the same manner as the first embodiment, and plural light-emitting devices 1 are thereby obtained.

Effects of the Embodiment

In the present embodiment, in addition to the effects of the first embodiment, the pressure applied to the glass 4 can be equalized in a region corresponding to the pressing surface 90a of the upper mold 9 since the outward flow of the glass 4 due to pressure is restricted. As a result, it is possible to surely fusion-bond the glass 4 to the $Al_2O_3$ substrate 3.

Other Embodiments

Although the method of manufacturing a light-emitting device according to the present invention has been described based on each of the above-mentioned embodiments, the invention is not intended to be limited to these embodiments and it is possible to implement in various features without going beyond a scope of the concept.

Although the hot pressing step is performed by, e.g., moving the upper mold 8 or 9 toward the lower mold 6 in each of the above-mentioned embodiments, the lower mold 6 may be moved toward the upper mold 8 or 9.

In addition, although the light-emitting device 1 is configured so that one light-emitting device 1 includes one LED element 2 in each of the above-mentioned embodiments, one light-emitting device 1 may include plural LED elements 2.

Furthermore, although a LED element is mounted on an $Al_2O_3$ substrate in each of the above-mentioned embodiments, it can be replaced with other ceramic substrates such as AlN substrate or metal substrates of W—Cu, etc.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A method of manufacturing a light-emitting device, comprising:

arranging a plate-shaped glass on a light-emitting element mounting surface of a substrate having a light-emitting element mounted thereon;

arranging a metal thin plate on the plate-shaped glass so as to sandwich the plate-shaped glass between the substrate and the metal thin plate;

placing the substrate, the plate-shaped glass and the metal thin plate between a first mold on a side of the substrate and a second mold on a side of the metal thin plate;

hot-pressing the substrate, the plate-shaped glass and the metal thin plate by using the first mold and the second mold to seal the light-emitting element with the plate-shaped glass; and after cooling the plate-shaped glass, removing the thin plate adhered to the plate-shaped glass from the plate-shaped glass.

2. The method of manufacturing a light-emitting device according to claim 1, wherein the metal thin plate has such a flexibility that it is deformed by an external force less than the cooled plate-shaped glass.

3. The method of manufacturing a light-emitting device according to claim 1, wherein the metal thin plate comprises one of tantalum, molybdenum, stainless steel and copper, and has a thickness of 0.02 to 0.5 mm.

4. The method of manufacturing a light-emitting device according to claim 1, wherein the second mold comprises a protrusion formed protruding toward the first mold, and the metal thin plate is formed along a shape of a pressing surface of the second mold including the protrusion.

5. The method of manufacturing a light-emitting device according to claim 4, wherein the protrusion is, in a bottom view of the second mold, shaped like a rectangular frame having a width about equal to that of the plate-shaped glass.

* * * * *